United States Patent
Kim et al.

(10) Patent No.: US 6,356,165 B1
(45) Date of Patent: Mar. 12, 2002

(54) MAGNETOSTATIC WAVE DEVICES FOR HIGH FREQUENCY SIGNAL PROCESSING

(75) Inventors: Meyng Soo Kim; Chang Hwa Lee; Dong Suk Jeon; Sang Seok Lee, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/493,221

(22) Filed: Jan. 28, 2000

(30) Foreign Application Priority Data

Dec. 21, 1999 (KR) .............................. 99-59762

(51) Int. Cl.$^7$ .............................. H03H 9/22; H03H 9/62; H01L 41/12
(52) U.S. Cl. .................. 333/148; 333/158; 333/195; 333/201; 333/202; 310/26
(58) Field of Search .................. 333/148, 158, 333/195, 201, 202, 219.2, 149–154; 310/26

(56) References Cited

U.S. PATENT DOCUMENTS

| | | | | |
|---|---|---|---|---|
| 3,864,647 A | * | 2/1975 | Bongianni | 333/141 |
| 4,199,737 A | | 4/1980 | Patterson et al. | 333/154 |
| 4,316,162 A | * | 2/1982 | Volluet et al. | 333/150 X |
| 4,318,061 A | * | 3/1982 | Castéra et al. | 333/153 X |
| 4,554,519 A | * | 11/1985 | Adam | 333/148 X |
| 4,571,562 A | * | 2/1986 | Castéra | 333/147 X |
| 4,675,682 A | * | 6/1987 | Adam et al. | 333/148 X |
| 4,983,937 A | | 1/1991 | Kinoshita et al. | 333/202 |
| 5,032,811 A | * | 7/1991 | Nishikawa et al. | 333/202 X |
| 5,663,698 A | | 9/1997 | Okada et al. | 333/202 |

OTHER PUBLICATIONS

K. Okubo et al.; "A New Magnetostatic Wave Delay Line Using YIG Film", *IEEE Transactions on Magnetics*, vol. 33, No. 3, May 1997, pp. 2338–2341.*

L.V. Tihonravova et al.; "Multipassband Electronically Tunable Magnetostatic Wave Filter", *Electronics Letters* Aug. 27$^{th}$, Aug. 1992, vol. 28, No. 18, pp 1719–1720.*

T. Nishikawa et al.; "A Low–Loss Magnetostatic Wave Filter Using Parallel Strip Transducer", *Microwave Symposium Digest 1989*, vol. 1, pp 153–156, Jun. 1989.*

"A New Method For Controlling Resonant Frequencies Of Straightedge MSW Resonators", Takuro Koike et al., 1994 Ultrasonics Symposium, pp. 781–784, Nov. 1994.

"A Study On Magnetostatic Surface Wave Excitation By Microstrip", Tatsuya Omori et al., IEICE Trans. Electron, vol. E77–C No. Feb. 2, 1994, pp. 312–318.

"Frequency Limits of MSSW in The Film With Two Magnetic Layers", Hu Wenzhong, APMC'93 vol. 2, pp. 10–29—10–31, 1993.

* cited by examiner

*Primary Examiner*—Robert Pascal
*Assistant Examiner*—Barbara Summons
(74) *Attorney, Agent, or Firm*—Jacobson Holman, PLLC

(57) ABSTRACT

Magnetostatic devices includes: input and output electrodes for including energy conversion pattern provided in a dielectric substrate; a multi-layer -magnetic substance structure placed at an upper portion of the dielectric substrate, wherein magnetically active thin film is placed at both sides of a magnetically inactive substrate; an upper shield, composed of grounded conductor, for preventing the input and output electrodes from coupling; a lower shield provided at the dielectric substrate, wherein the substrate contain a hole with the same length as the upper shield, and walls of said hole are provided with conductor; a magnetostatic wave end portion, inserted into the dielectric substrate to be placed at both end plane of the multi-layer magnetic structure, for blocking the magnetostatic wave not to reflect therefrom; and a magnetostatic wave reflector, provided in the dielectric substrate as a line whose width vary, for reflecting and selecting a desired pass band before it reaches to the magnetostatic wave end portion.

14 Claims, 18 Drawing Sheets

MAGNETOSTATIC WAVE DEVICES FOR HIGH FREQUENCY SIGNAL PROCESSING

FIELD OF THE INVENTION

This invention relates to magnetostatic wave devices for processing high frequency signals; and, more particularly, to devices, which is capable of reducing a variation for each of frequencies within a pass band.

DESCRIPTION OF THE PRIOR ART

In the field of magnetostatic wave devices, a high frequency filter, a delay line, a resonator, and a correlator are implemented through the use of a magnetostatic wave in order to cope with high frequency signals. To implement the magnetostatic wave devices, input and output electrodes are provided on a magnetically active ferromagnetic thin film on a magnetically inactive dielectric substrate, or a ferromagnetic thin film is placed on the magnetically inactive dielectric substrate after the input and output electrodes are produced. An appropriate magnetic field is then applied for energy conversion and transmission. According to prior art, input and output electrodes are lines having same size or multiple lines. In case of multiple lines, a distance between neighboring lines is constant. For both cases, a variation of wavelength for each frequency in a desired pass band of the devices is not considered effectively, thereby providing a severe characteristic variation in the pass band. A ferromagnetic thin film is provided in one side of the magnetically inactive substrate. The ferromagnetic thin film is provided in both sides to adjust a group speed by employing magnetically different thin films. Further, there is no metal shield for electrically separating input and output portions, and a coupling between the input and output portions is generated outside the pass band, thereby transmitting energy which is not desired.

FIG. 1 illustrates a schematic diagram of a prior magnetostatic wave device shown from the top, and FIG. 2 presents the prior magnetostatic wave device in FIG. 1 shown from the front. As shown, the magnetostatic wave device includes an input transmission line 12a, an output transmission line 13a, an input energy conversion portion 12b, an output energy conversion portion 13b, and a magnetically active ferromagnetic substance 14b. The input and output lines 12a and 13b having a constant width are placed on one side of a dielectric substrate 11 whose the other side is grounded 16. The input and output energy conversion portions 12b and 13b generating energy conversion between electromagnetic wave and magnetostatic wave are composed of multiple number of lines each of which has a constant width w1 or w3, a length L1 and distances g1, g2 between neighboring lines (See FIG. 3). The ferromagnetic substance 14b is provided on a magnetically active substrate 14a.

When a magnetic field with a magnitude larger than saturated magnetization is applied to the magnetostatic wave device, the magnetically active ferromagnetic substance 14b is saturated. When an electromagnetic wave within the frequency band can be absorbed by the magnetized ferromagnetic substance is transmitted to the input energy conversion portion 12b, the electromagnetic wave is magnetically coupled and a magnetostatic wave is generated. The magnetostatic wave is transmitted to the output energy conversion portion 13b through the magnetized ferromagnetic substance and then re-converted to the electromagnetic wave, resulting in energy transmission.

A multi-layer structure 14 including the ferromagnetic substance 14b, and end portions 15a and 15b are illustrated in FIG. 1.

Referring to FIG. 3, line structure of the input and output energy conversion portions 12b and 13b employed in the prior magnetostatic wave devices are illustrated. The energy conversion lines for electromagnetic wave and magnetostatic wave are single lines each having the constant width w1 or w3 in the direction of current flow, and multiple number of the single lines each having a length L1 are placed with a constant distance g1 or g2.

The conversion line described above is employed to select a specific frequency and is good at obtaining a narrow band characteristic. However, it lowers efficiency in selecting a specific frequency band, thereby distorting a pass band characteristic as shown in FIG. 31. Further, since there is no means to block electromagnetic wave coupling between the input and output energy conversion portions, energy is also transmitted by a transmission of the magnetostatic wave as a frequency increase. Thus, the value outside the pass band becomes high as shown in FIG. 31, thereby degrading a frequency selectivity for the device.

In addition, when ground planes are placed with a constant distance at the magnetized ferromagnetic substance as shown in FIG. 1, a group delay characteristic related to a group speed of the magnetostatic wave is not linear, thereby generating phase error.

In accordance with the prior magnetostatic wave device described above, multiple number of lines which has a constant distance between neighboring lines are employed as the input and output electrodes, thereby providing a severe variation of characteristics within the pass band. In addition, in order to increase the pass band there is needed the ferromagnetic substance having a larger width.

Further, since there is no metal shield to electrically separate the input and output energy conversion portions, the input and output energy conversion portions are coupled outside the pass band, thereby generating a larger energy transmission.

SUMMARY OF THE INVENTION

It is, therefore, an object of the present invention to provide magnetostatic wave devices for processing high frequency signals, which is capable of reducing a variation within the pass band of the device and blocking energy transmission outside the pass band by reducing energy emission on non-magnetization.

Magnetostatic wave devices of the present invention comprises: input and output electrodes for including energy conversion pattern provided in a dielectric substrate; a multi-layer magnetic substance structure placed at an upper portion of the dielectric substrate, wherein magnetically active thin film is placed at both sides of a magnetically inactive substrate; an upper shield, composed of grounded conductor, for preventing the input and output electrodes from coupling; a lower shield provided at the dielectric substrate, wherein the substrate contain a hole with the same length as the upper shield, and walls of said hole are provided with conductor; a magnetostatic wave end portion, inserted into the dielectric substrate to be placed at both end plane of the multi-layer magnetic structure, for blocking the magnetostatic wave not to reflect therefrom; and a magnetostatic wave reflector, provided in the dielectric substrate as a line whose width vary, for reflecting and selecting a desired pass band before it reaches to the magnetostatic wave end portion.

BRIEF DESCRIPTION OF THE DRAWINGS

The above and other objects and features of the present invention will become apparent from the following description of preferred embodiments given in conjunction with the accompanying drawings, in which:

FIG. 10 shows a vertical cross sectional diagram illustrated by cutting the diagram shown in FIG. 9 along a line V1–V1', presenting the portion which there is no shield on;

FIG. 14 presents a vertical cross sectional diagram illustrated by cutting the diagram shown in FIG. 9 along a line V5–V5', presenting the portion which there is no upper and lower shields on;

DETAILED DESCRIPTION OF THE PREFERRED EMBODIMENTS

Figure 1:
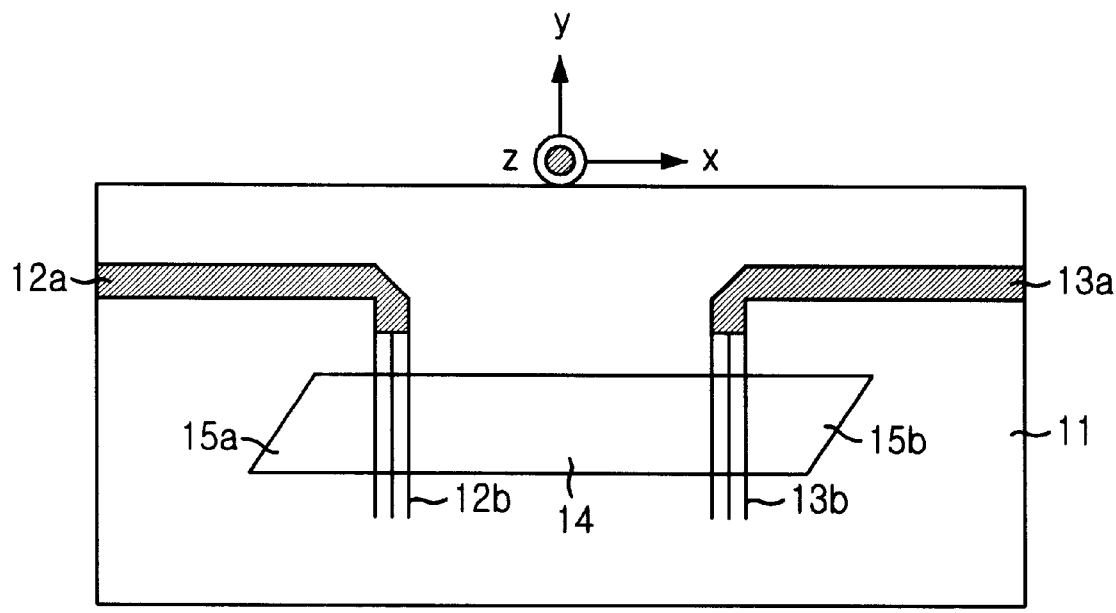
FIG. 1 illustrates a schematic diagram of a prior magnetostatic device shown from the top.
Figure 2:
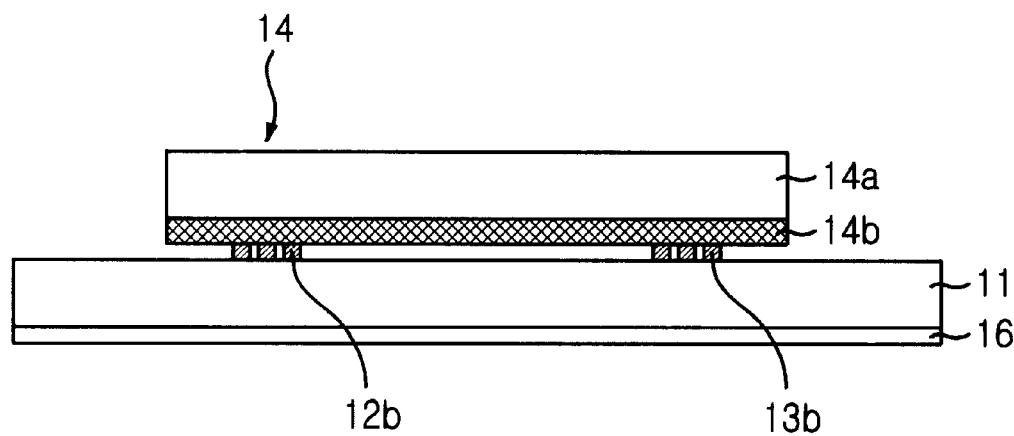
FIG. 2 presents the prior magnetostatic device in FIG. 1 shown from the front.
Figure 3:
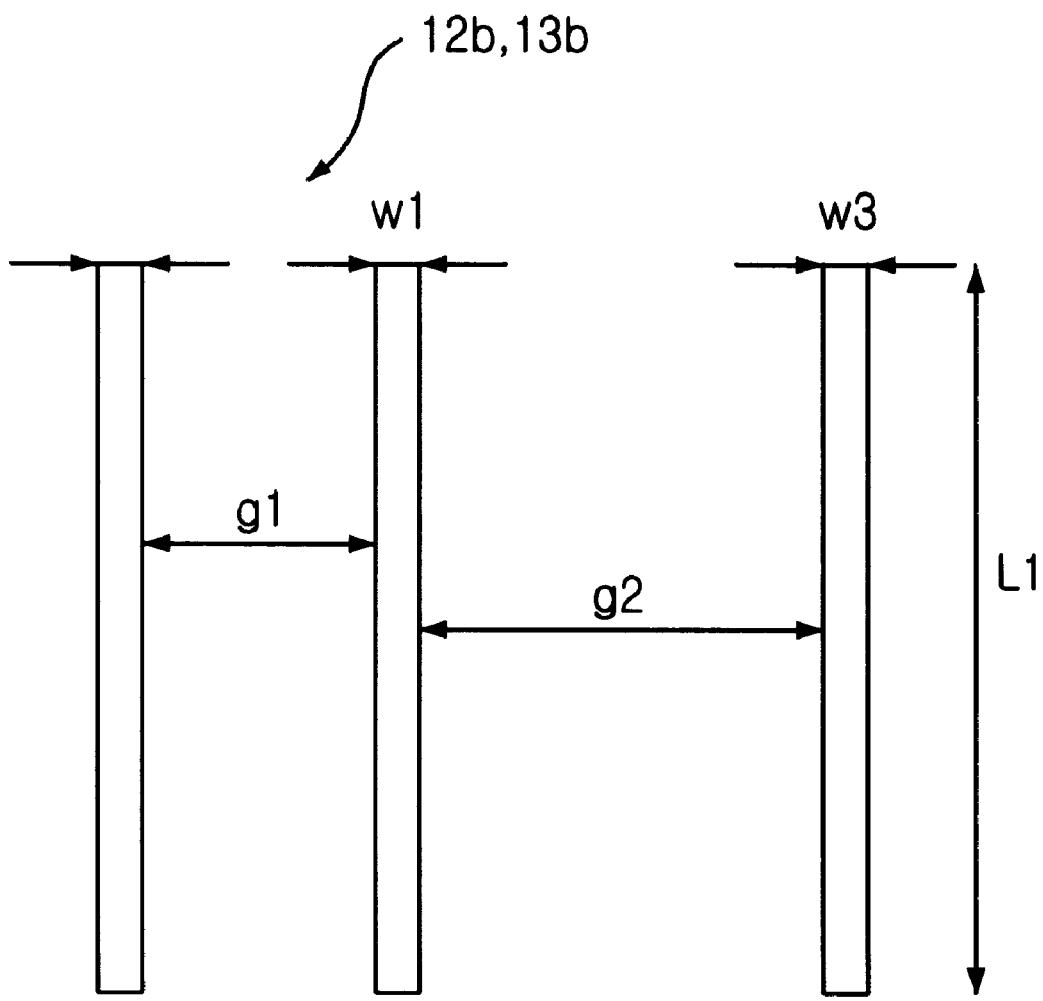
FIG. 3 shows a diagram illustrating input and output energy conversion lines of the device in FIG. 1.
Figure 4:
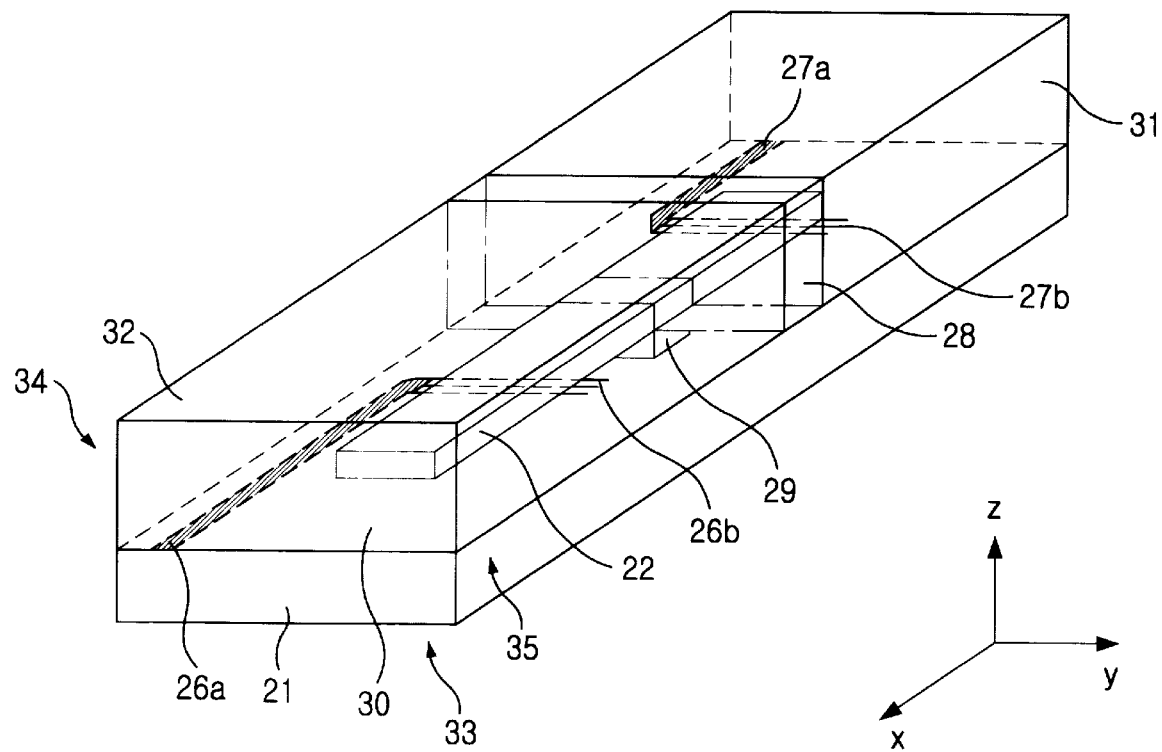
FIG. 4 illustrates a schematic diagram of a magnetostatic device in accordance with one embodiment of the present invention.
Figure 5:
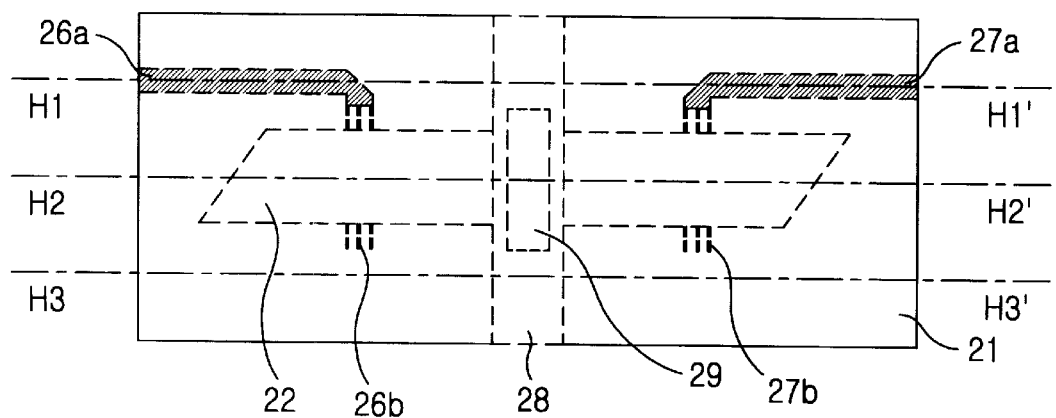
FIG. 5 presents a diagram shown from the top of the device in FIG. 4, which includes horizontal lines thereon.

FIG. 4 illustrates the magnetostatic device in accordance with the present invention, and FIG. 5 presents a diagram shown from the top of the device in FIG. 4, which includes horizontal lines thereon.

Referring to FIGS. 4 and 5, the magnetostatic device includes a low-loss dielectric substrate 21, input and output lines 26a and 27a, input and output energy conversion lines 26b and 27b, multi-layer ferromagnetic substance structure 22, upper and lower shield 28 and 29, and low-loss dielectric blocks 30 and 31.

The input and output lines 26a and 27a, and the input and output energy conversion lines 26b and 27b are provided at upper portion of the dielectric substrate 21 including lower grounded plane 33. The multi-layer ferromagnetic substance structure 22 is active ferromagnetic substance provided on the input and output energy conversion lines 26b and 27b. It is propagation medium for magnetostatic wave and is placed between upper and lower shields 28 and 29. The low-loss dielectric blocks 30 and 31 are placed between the grounded upper and lower planes 32 and 33. The upper shield 28 on the multi-layer ferromagnetic substance structure 22 with a constant width is placed across the upper portion of the multi-layer ferromagnetic substance structure 22 to block energy transmission between input and output electrodes. The lower shield 29 contains a small hole having the same length as the upper shield 28 in y-direction at lower portion of the multi-layer ferromagnetic substance structure 22, or a grounded conductor filled therein at the center portion of the dielectric substrate 21.

The grounded lower plane 33 including the lower shield 29 is provided at the lower portion of the dielectric substrate 21, and the multi-layer ferromagnetic substance structure 22 includes ferromagnetic substance such as YIG(Yttrium Iron Garnet) thin film and is a magnetically inactive substrate which is provided between the ferromagnetic substance and contains GGG(Gadolinium Gallium Garnet).

The input and output energy conversion lines 26b and 27b are multiple lines of various widths. The upper and lower shields 28 and 29 makes a conductive duct around the portion of the multi-layer ferromagnetic substance structure 22 inserted. Especially, the lower shield 29 is a grounded hole or a grounded structure filled with conductor. Two or more ferromagnetic thin films are placed between the input and output energy conversion lines 26b and 27b in parallel to adjust characteristic of the devices.

The dielectric substrate 21 can include a shield composed of conductive structure that is equal to or smaller than the length of the substrate and is placed between cross sections of the substrate 21. The upper shield 28 can contain a shield composed of grounded upper plane without the lower shield 29. The lower shield 29 can includes a shield composed of conductive structure, in which a rectangular hole equal to or smaller than the length of the dielectric substrate is provided in the dielectric substrate and a conductive layer is provided to connect the rectangular wall of the rectangular hole to the plane.

Front and rear walls 34 and 35 of the magnetostatic wave device can be shielded by a conductor or be open as a strip line. Input electromagnetic wave energy is transmitted to the direction of positive or negative x-coordinate at the input energy conversion line 26b, and the magnetostatic wave is then re-converted to electromagnetic wave at the output energy conversion line 27b and transmitted to the output line 27a. The multi-layer ferromagnetic substance structure 22 works as propagation medium for the magnetostatic wave. The low-loss dielectric blocks 30 and 31 are placed between the upper shield 28 and the grounded upper plane 33. When magnetic field is applied in directions of x, y, and z coordinates, magnetostatic reverse volume wave, magnetostatic surface wave and magnetostatic forward volume wave are produced respectively and propagated to the direction of x-coordinate, resulting in energy transmission.

According to an embodiment of the present invention, high frequency signal applied to the input line 26a is converted to magnetostatic wave at the input energy conversion line 26b and the multi-layer ferromagnetic substance structure 22. The converted magnetostatic wave is propagated through the multi-layer ferromagnetic substance structure 22 and is then re-converted to high frequency signal at the output energy conversion line 27b. The re-converted high frequency signal is output through the output line 27a.

Figure 6:
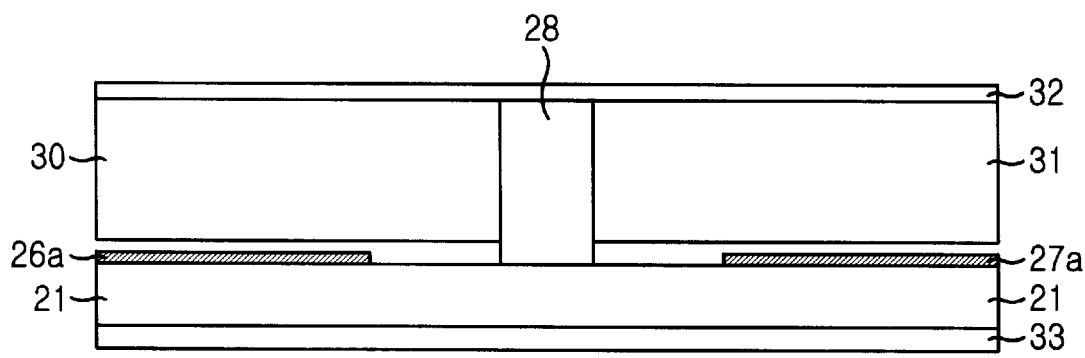
FIG. 6 illustrates a cross sectional diagram of FIG. 5 cut along a line H1–H1'.
Figure 7:
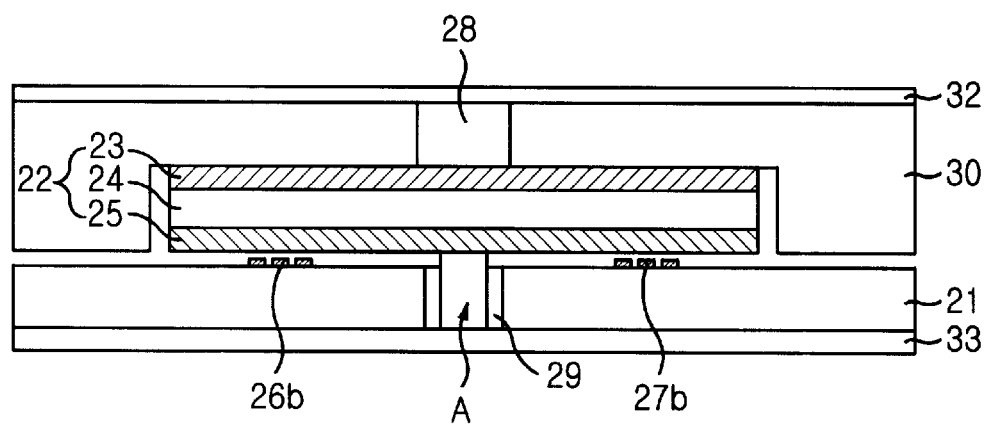
FIG. 7 illustrates a cross sectional diagram of the portion of the upper and lower shields shown in FIG. 5 cut along a line H2–H2'.
Figure 8:
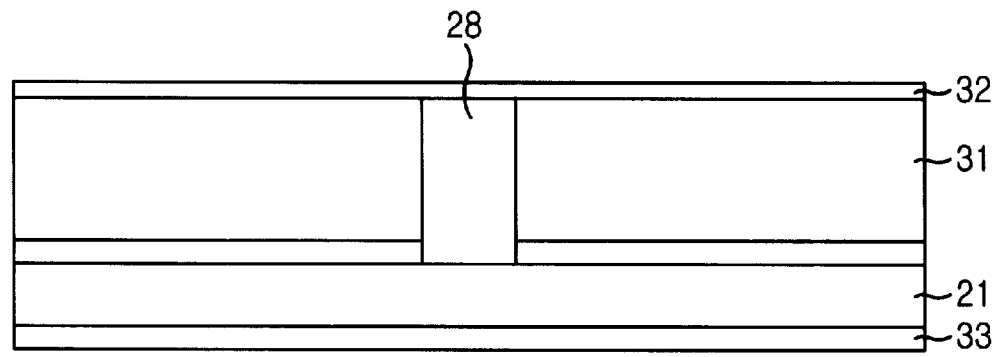
FIG. 8 shows a cross sectional diagram of FIG. 5 cut along a line H3–H3'.

FIG. 6 illustrates a cross sectional diagram of FIG. 5 cut along a line H1–H1' and shown outside of the shield in the dielectric substrate. FIGS. 7 and 8 shows cross sectional diagrams of FIG. 5 cut along lines H2–H2' and H3–H3', respectively.

Referring to FIG. 6, the multi-layer ferromagnetic substance structure 22 is not illustrated. The input and output lines 26a and 27a are provided at upper portion of the low-loss dielectric substrate 21 including the grounded lower plane 33 with constant distance. The low-loss dielectric blocks 30 and 31 are provided on upper portion of the input and out lines 26a and 27a, and the upper shield 28 connected to the grounded upper plane 32 and the dielectric substrate 21 through the low-loss dielectric blocks 30 and 31 is produced.

Referring to FIG. 8, the multi-layer ferromagnetic substance structure 22, the input and output lines 26a and 27a, and the input and output energy conversion lines 26b and 27b as shown in FIG. 6 are not presented. The low-loss dielectric blocks 30 and 31 are provided at the upper portion of the low-loss dielectric substrate 21 including grounded lower plane 33, the grounded upper plane 32 is provided at the upper portion of the low-loss dielectric blocks 30 and 31. The upper shield 28 connected to the grounded upper plane 32 and the dielectric substrate 21 through the low-loss dielectric blocks 30 and 31 is provided.

FIG. 7 illustrates a cross sectional diagram of the portion of the upper and lower shields 28 and 29 shown in FIG. 5 cut along a line H2–H2'. As shown, the multi-layer ferromagnetic substance structure 22 containing ferromagnetic substance 23 and 25 is placed through the open space of upper shield 28. The input electromagnetic wave energy from the input line 26a is resonated by the length of the input energy conversion line 26b. The magnetostatic wave having a constant frequency band is generated in the magnetized ferromagnetic substance 23 and 25 of the multi-layer ferromagnetic substance structure 22, which is magnetized in the resonant frequency band. The magnetostatic wave is then transmitted to the output energy conversion line 27b through the ferromagnetic substance 23 and 25 placed as an open space of the lower shield 29 which is composed of walls of the rectangular hole or grounded plane structure. The rectangular hole is provided in the upper shield 28 and the low-loss dielectric substrate 21. When the lower shield 29 is provided with more longer length of y-coordinate direction, FIGS. 6 and 8 become the same as FIG. 7, and the lower shield 29 is placed at the center of the dielectric substrate 21 separated to two portions.

Figure 9:
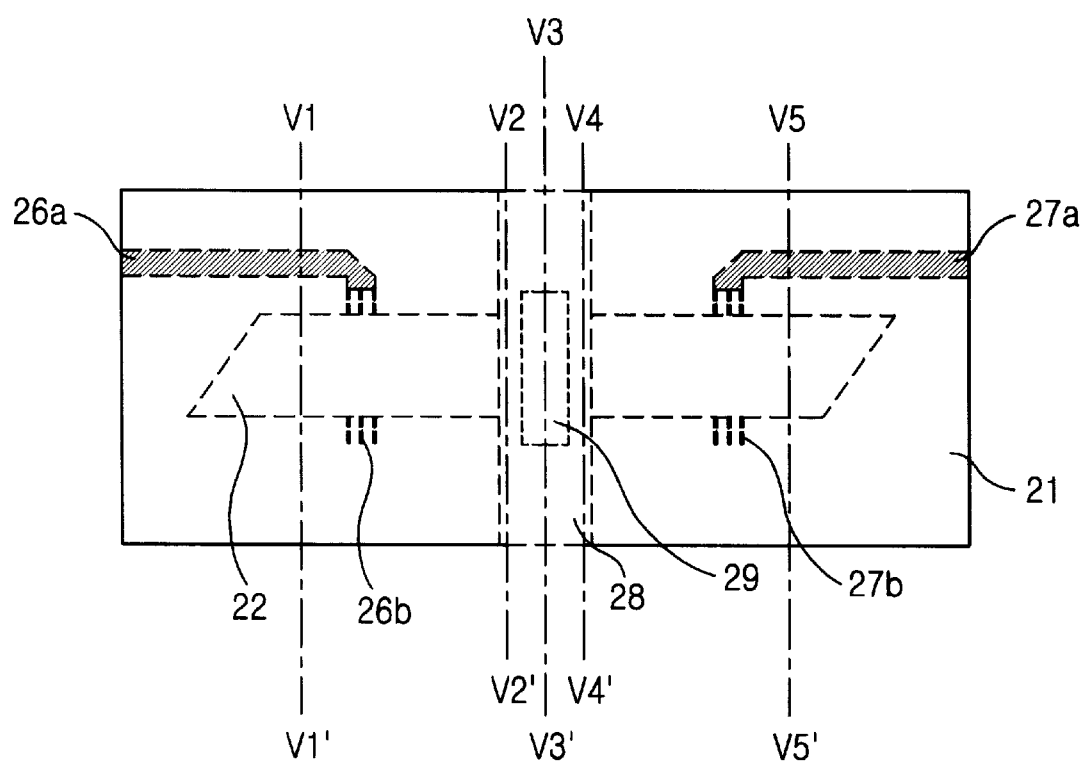
FIG. 9 illustrates a diagram shown in FIG. 4, which includes vertical lines thereon.

FIG. 9 illustrates a diagram shown in FIG. 4, which includes vertical lines thereon. It can be described with the same fashion as FIG. 5.

Figure 10:
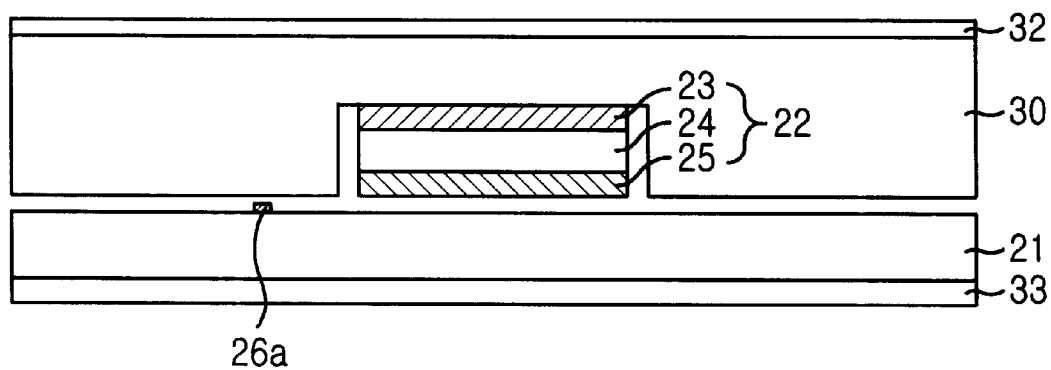
Figure 11:
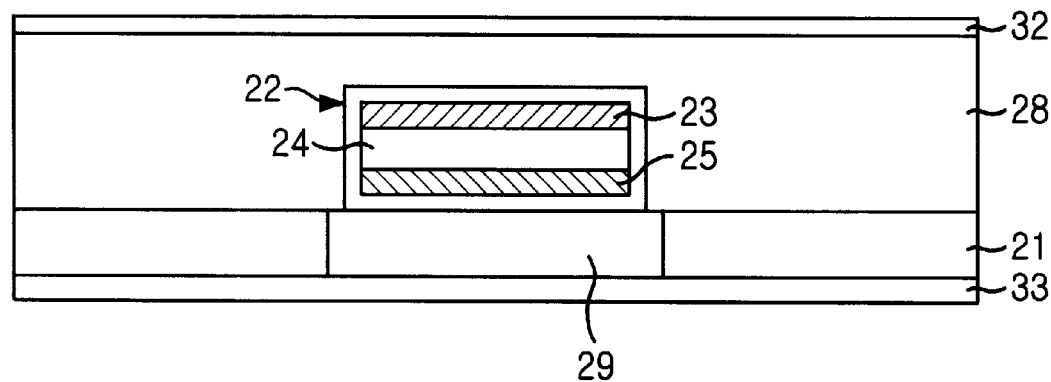
FIG. 11 presents a vertical cross sectional diagram illustrated by cutting the diagram shown in FIG. 9 along a line V2–V2', presenting the beginning portion of the shield.

FIG. 10 is a vertical cross sectional diagram illustrated by cutting the diagram shown in FIG. 9 along a line V1–V1', presenting the portion which there is no shield on. FIG. 11 is a vertical cross sectional diagram illustrated by cutting the diagram shown in FIG. 9 along a line V2–V2', presenting the beginning portion of the shield.

The open space, in which the multi-layer ferromagnetic substance structure 22 is placed, has cutoff frequency. Electromagnetic wave having lower frequency than the cutoff frequency cannot pass through. An operating frequency of the magnetostatic wave device lower than the cutoff frequency is passed through the magnetized ferromagnetic substance, resulting in energy transmission through the open space.

Figure 12:
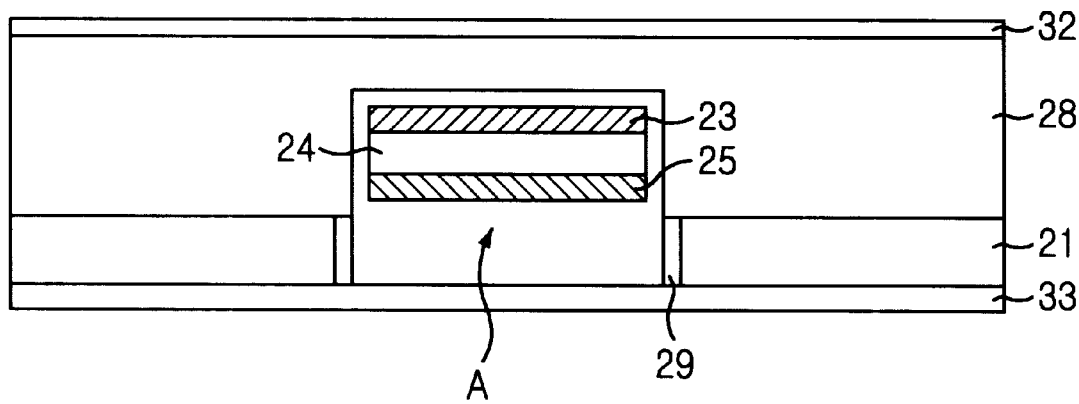
FIG. 12 shows a vertical cross sectional diagram illustrated by cutting the diagram shown in FIG. 9 along a line V3–V3', presenting the center portion of the upper and lower shields.

FIG. 12 is a vertical cross sectional diagram illustrated by cutting the diagram shown in FIG. 9 along a line V3–V3', presenting the center portion of the upper and lower shields 28 and 29. A rectangular hole A is provided in the dielectric substrate.

Figure 13:
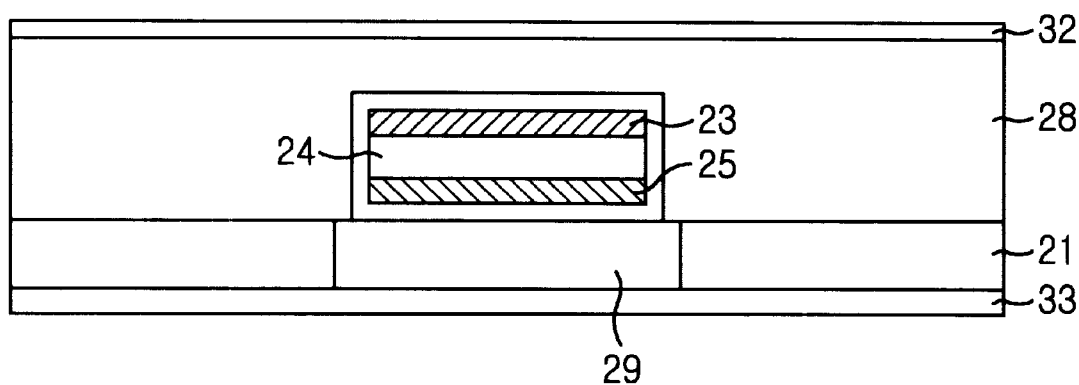
FIG. 13 shows a vertical cross sectional diagram illustrated by cutting the diagram shown in FIG. 9 along a line V4–V4', presenting the beginning portion of the upper and lower shields, wherein the lower shield 29 is connected to lower plane.

FIG. 13 is a vertical cross sectional diagram illustrated by cutting the diagram shown in FIG. 9 along a line V4–V4', presenting the beginning portion of the upper and lower shields 28 and 29, wherein the lower shield 29 is connected to the grounded lower plane.

Figure 14:
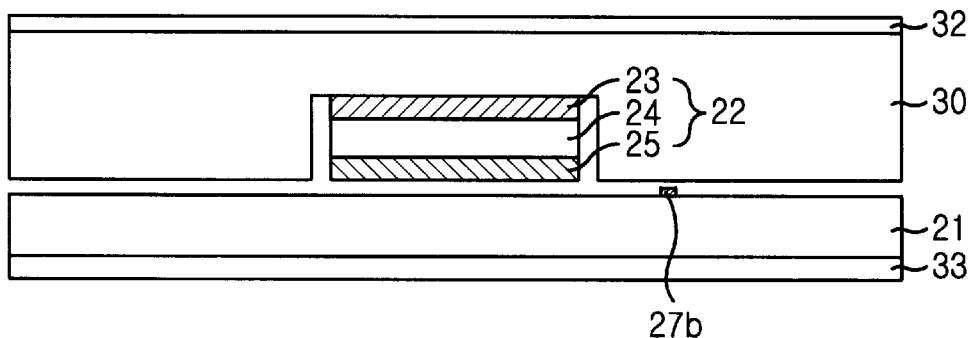

FIG. 14 is a vertical cross sectional diagram illustrated by cutting the diagram shown in FIG. 9 along a line V5–V5', presenting the portion which there is no upper and lower shields on.

Figure 33:
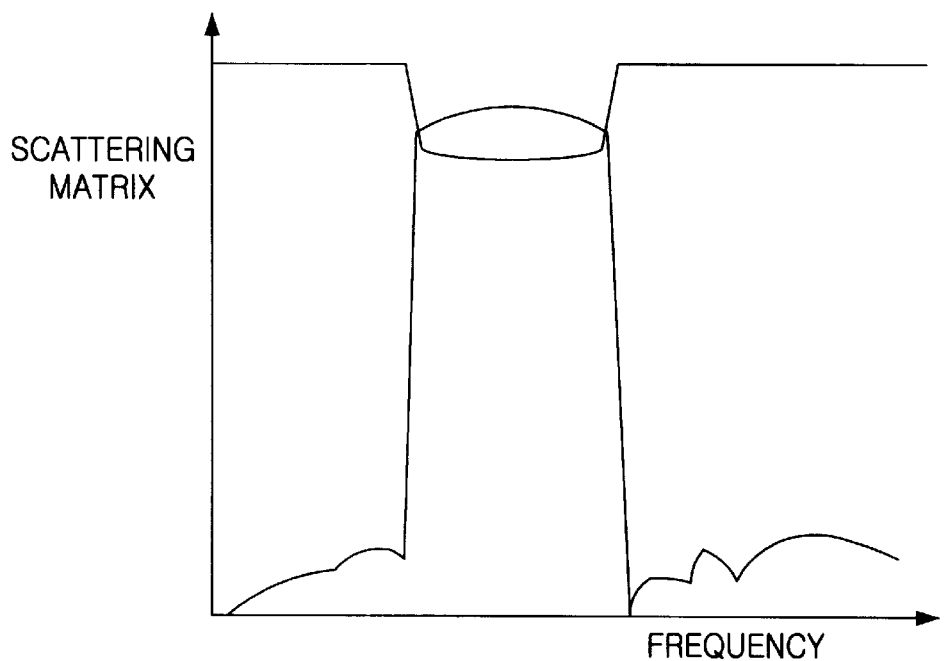
FIG. 33 illustrates the scattering matrix of magnetostatic wave device having reduced electromagnetic wave coupling between the input and output electrodes and reduced variation within the pass band in accordance with the present invention.
Figure 34:
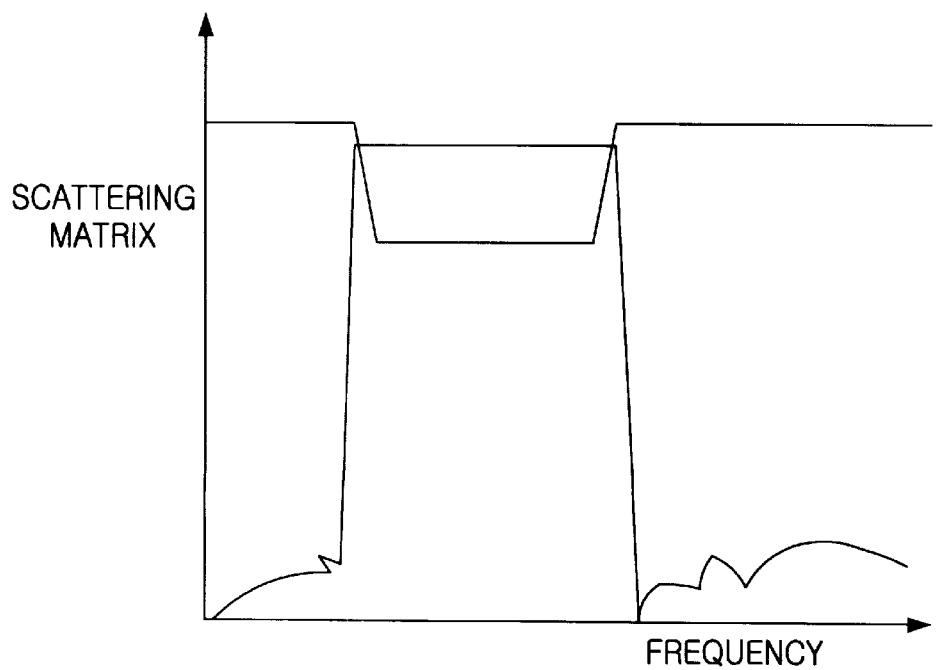
FIG. 34 illustrates the scattering matrix of the magnetostatic wave device having increased pass band.

According to the embodiment of the present invention described above, an electromagnetic wave coupling between the input and output electrodes generated outside the pass band of magnetostatic devices can be reduced as shown in FIG. 33 by means of the upper and lower shields or a shielding wall.

Figure 15:
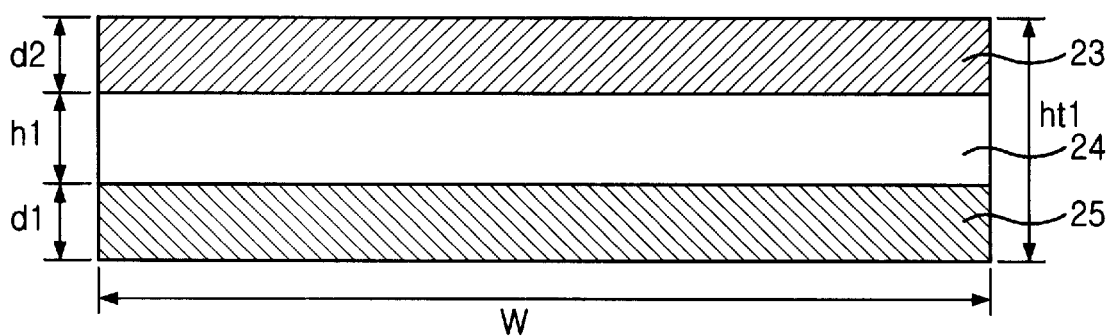
FIG. 15 illustrates a multi-layer ferromagnetic substance structure in accordance with an embodiment of the present invention, which is employed as transmission medium of the magnetostatic wave for increasing the pass band of the magnetostatic wave device.

Referring to FIG. 15, an embodiment of the multi-layer ferromagnetic substance structure with a thickness ht1 and a width W employed as propagation medium of the magnetostatic wave for increasing the pass band of the device is illustrated.

As shown, two ferromagnetic substances 23 and 25 are provided at both sides of the magnetically inactive substrate 24. When a non-magnetic substance 24 with thickness h1, placed between the two ferromagnetic substances 23 and 25 with respective thickness of d1 and d2, is used instead of one layer ferromagnetic substance with thickness of d1+d2, we can achieve larger pass band. Thus, the multi-layer structure containing dielectric substance shown in FIG. 15 results in increasing the pass band of the magnetostatic device and achieving low-loss transmission characteristic.

Figure 16:
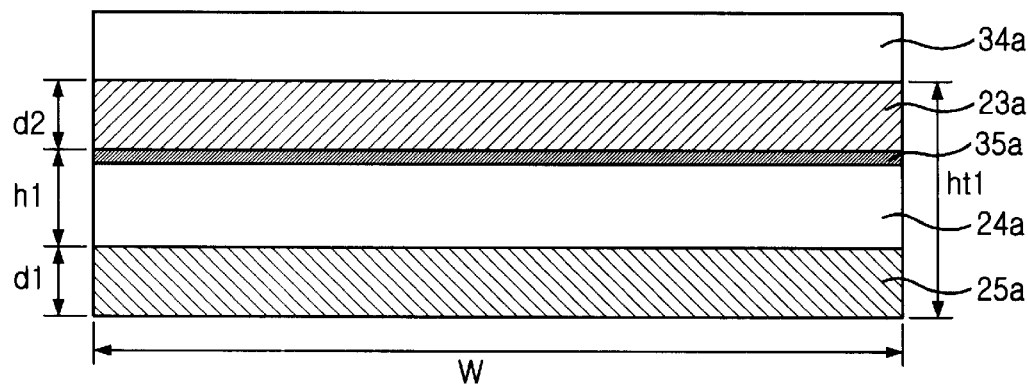
FIG. 16 illustrates a multi-layer ferromagnetic substance structure in accordance with an another embodiment of the present invention, which is employed as transmission medium of the magnetostatic wave for increasing the pass band of the magnetostatic wave device.

FIG. 16 illustrates another embodiment of the multi-layer ferromagnetic substance structure which is employed as propagation medium for the magnetostatic wave to increase the pass band of the magnetostatic wave device. The multi-layer ferromagnetic substance structure has a width W and a thickness ht1. Two ferromagnetic substances 23b and 25a are provided at one side of the magnetically inactive substrates 34a and 24a, respectively, and a conductor pattern 35a is provided at the other side of the substrate 24a. The area for magnetostatic wave generation, increased by separating the two ferromagnetic substances 23b and 25a, is adjusted by the conductor pattern 35a.

Figure 17:
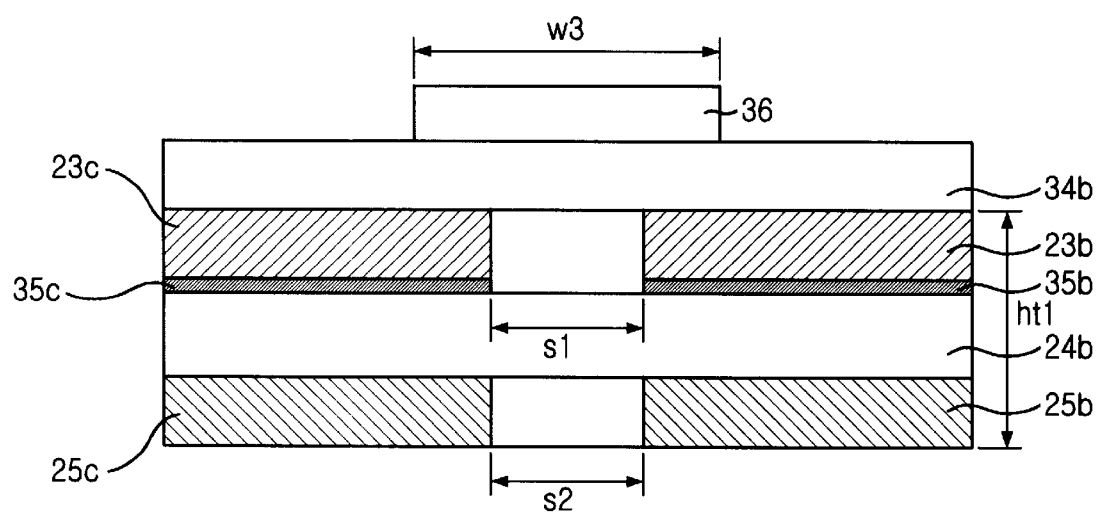
FIG. 17, illustrates a multi-layer ferromagnetic substance structure in accordance with an another embodiment of the present invention.

Referring to FIG. 17, a combined diagram of two diagrams shown in FIGS. 15 and 16 is illustrated. Constant distance s1 and s2 is provided at the conversion portion in the multi-layer ferromagnetic substance structure containing the magnetically inactive substrate 24b and 33b, conductor pattern 35b, 35c and ferromagnetic substances 23b, 23c, 25b, and 25c in the direction of current flow. By adjusting this distance, the area for the magnetostatic wave generation is adjusted. Another ferromagnetic substance layer 36 having a width w3 is placed to increase the electromagnetic wave coupling at the space s1 and s2.

Figure 18:
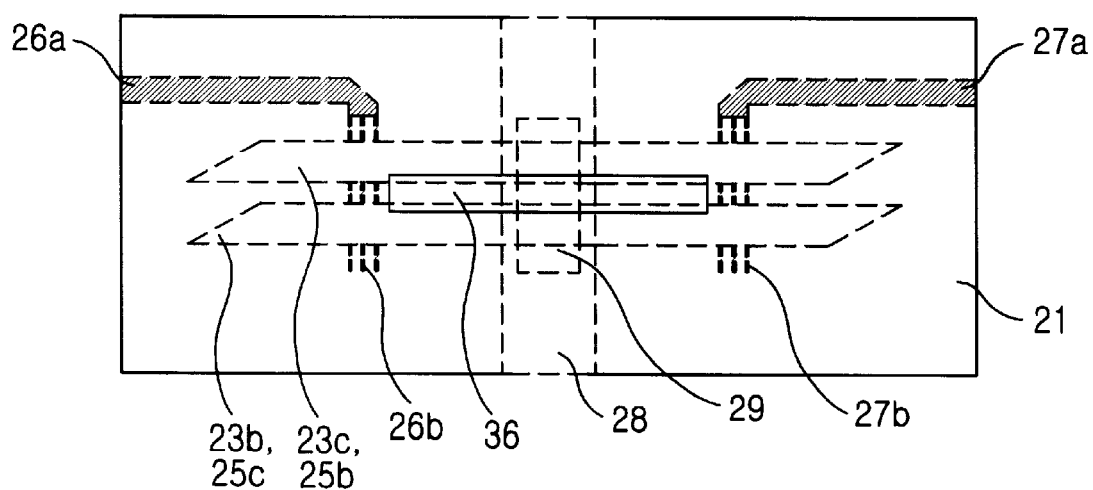
FIG. 18 illustrates a schematic diagram shown from the top of the magnetostatic wave device employing the multilayer structure presented in FIG. 17.

FIG. 18 illustrates a schematic diagram shown from the top of the magnetostatic wave device employing the multi-layer structure presented in FIG. 17.

Figure 19:
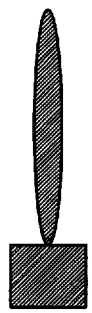
FIGS. 19 to 26 illustrate various energy conversion lines in accordance with the present invention.
Figure 20:
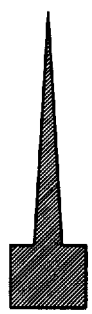
Figure 32:
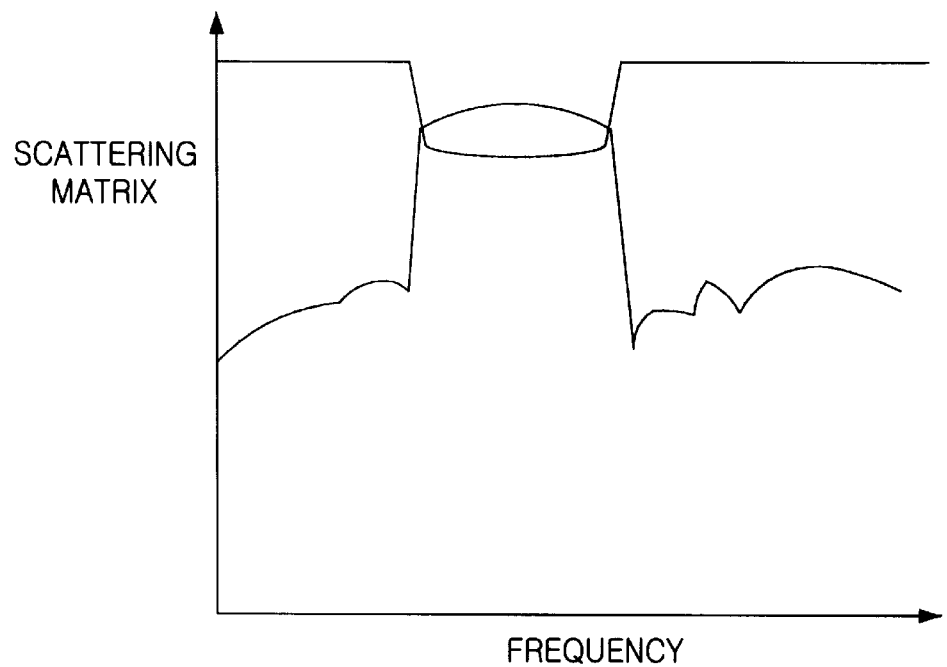
FIG. 32 illustrates the scattering matrix of the magnetostatic wave device having reduced variation within the pass band in accordance with the present invention.

FIGS. 19 and 20 illustrate single conversion line whose width varies in y-direction which is the direction of the current flow. By varying line width, current distribution is changed, reducing variation of transmission characteristic in the pass band as shown in FIG. 32.

Figure 21:
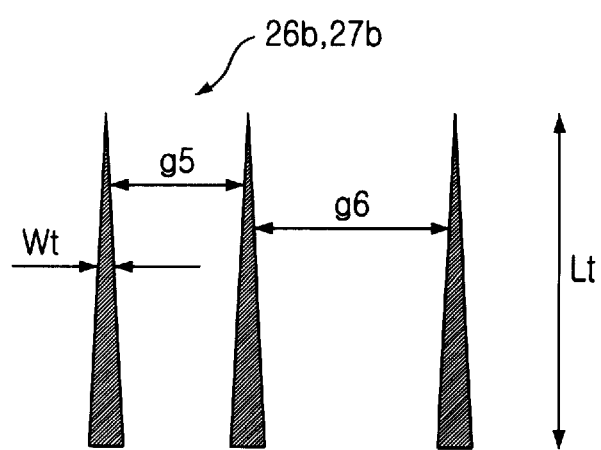
Figure 22:
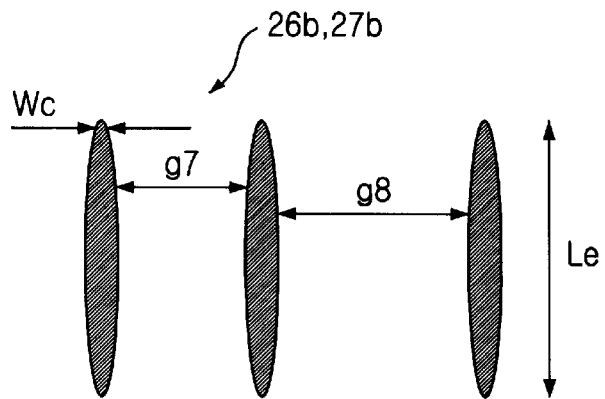
Figure 23:
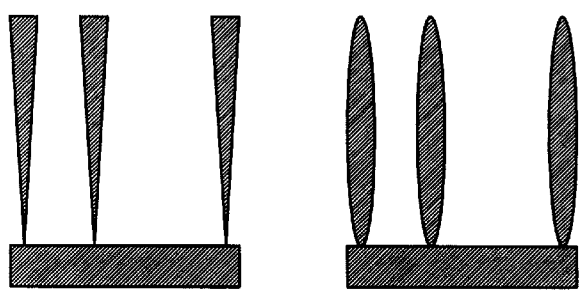
Figure 24:
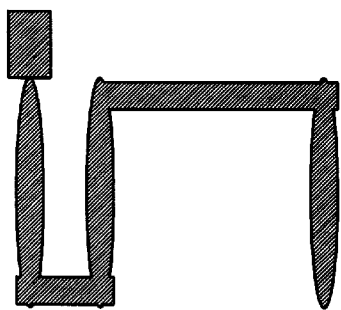
Figure 25:
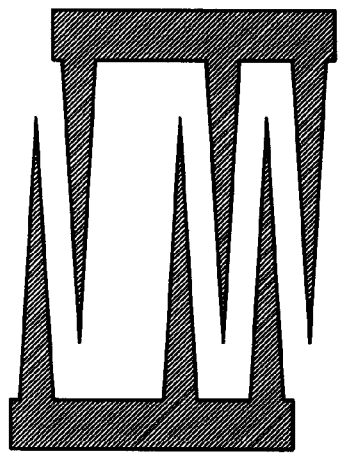
Figure 26:
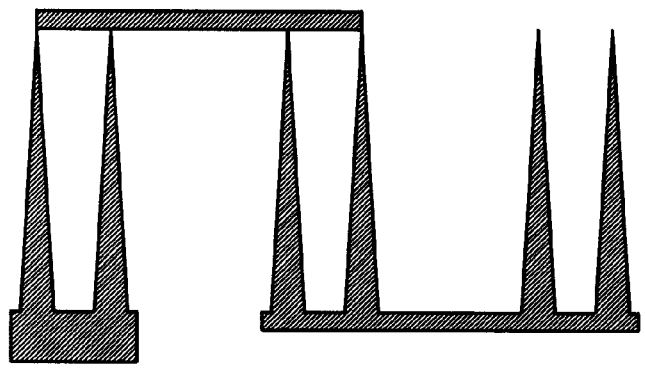

FIGS. 21 and 22 illustrate multiple conversion lines whose distances g5, g6, g7, g8 between lines and each line width Wt, Wc vary to the direction of length Le or Lt, rendering a constant selectivity for frequencies, and reducing variation of transmission characteristic in the pass band.

FIGS. 23 to 26 illustrate various examples of conversion lines through the use of the diagram shown in FIGS. 19 and 20.

Figure 27:
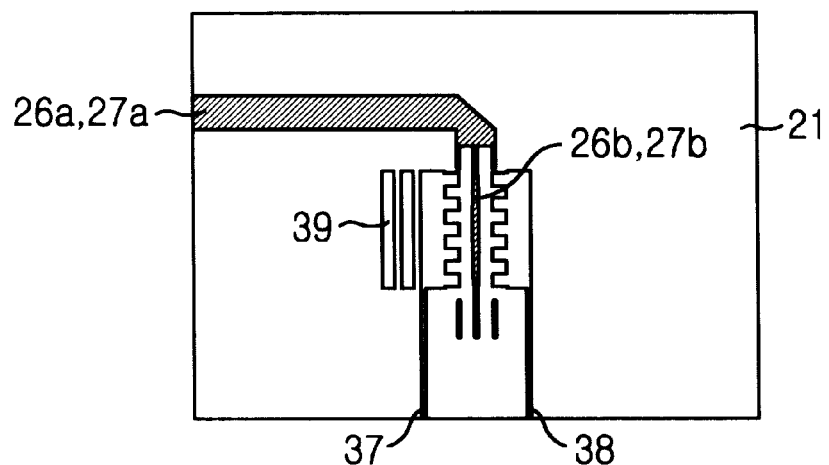
FIG. 27 illustrates a diagram for a pattern capable of adjusting an impedance of the magnetostatic wave device in accordance with the present invention.

Referring to FIG. 27, inductance and capacitance capable of further reducing the width of the conversion line is illustrated by providing a coupling line around the conversion lines 26a and 27a. The coupling line is electromagnetic coupling pattern 37 and 38 whose one end is grounded and an electromagnetic coupling pattern 39 whose both end are not grounded. By adjusting the patterns 37, 38, and 39, magnetostatic wave emission energy and impedance need to be matched can be adjusted.

Figure 28:
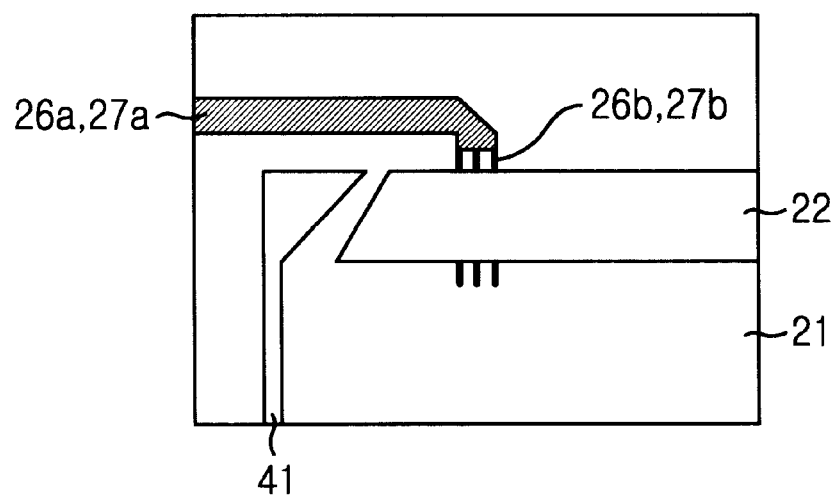
FIG. 28 illustrates a conductive terminator for the magnetostatic wave in accordance with the present invention.

Referring to FIG. 28, a conductive end portion for blocking the magnetostatic wave is illustrated. In order not to reflect the wave reached to the end, magnetostatic wave terminator 41 whose one end is grounded to be placed by both sides of the end of the ferromagnetic substance in the multi-layer ferromagnetic substance structure 22, is inserted onto the dielectric substrate 21.

Figure 29:
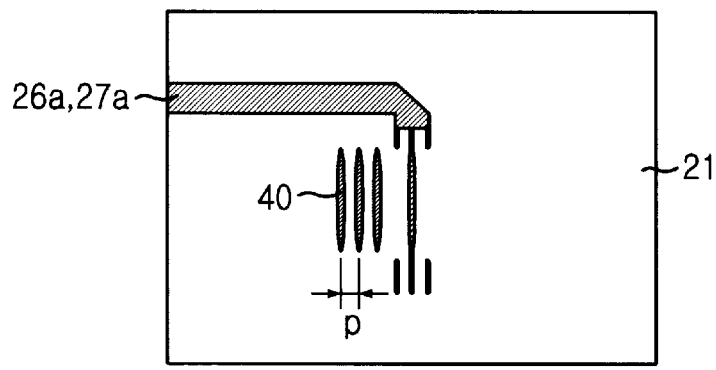
FIG. 29 illustrates a magnetostatic wave conductive reflector in accordance with the present invention, which is capable of reflecting and selecting the desired pass band before it reach to the terminator.

FIG. 29 illustrates a magnetostatic wave reflector which is capable of reflecting and selecting the desired pass band before it reaches to the end portion. The reflector is not placed in the ferromagnetic substance, and the conductive line 40 with variable width is placed on the dielectric substrate 21 with half the period p of the magnetostatic wave.

Figure 30:
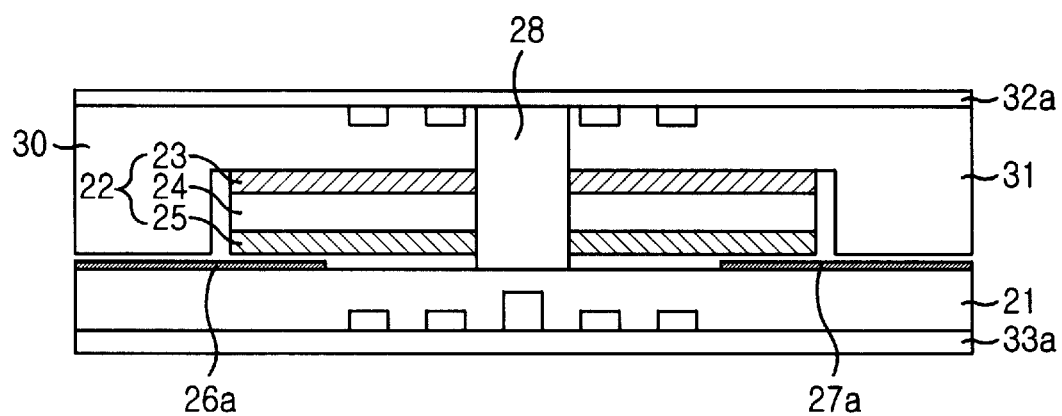
FIG. 30 illustrates a ground plane layer plane in accordance with the present invention, in which a distance of the ground plane is changeable.
Figure 31:
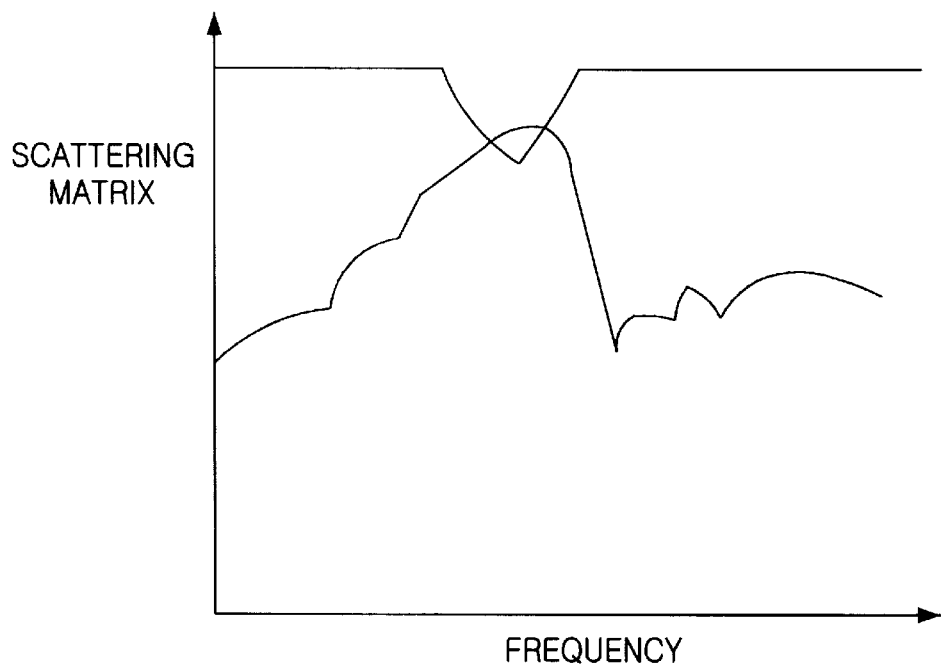
FIG. 31 illustrates a scattering matrix of prior magnetostatic wave device.
Figure 35:
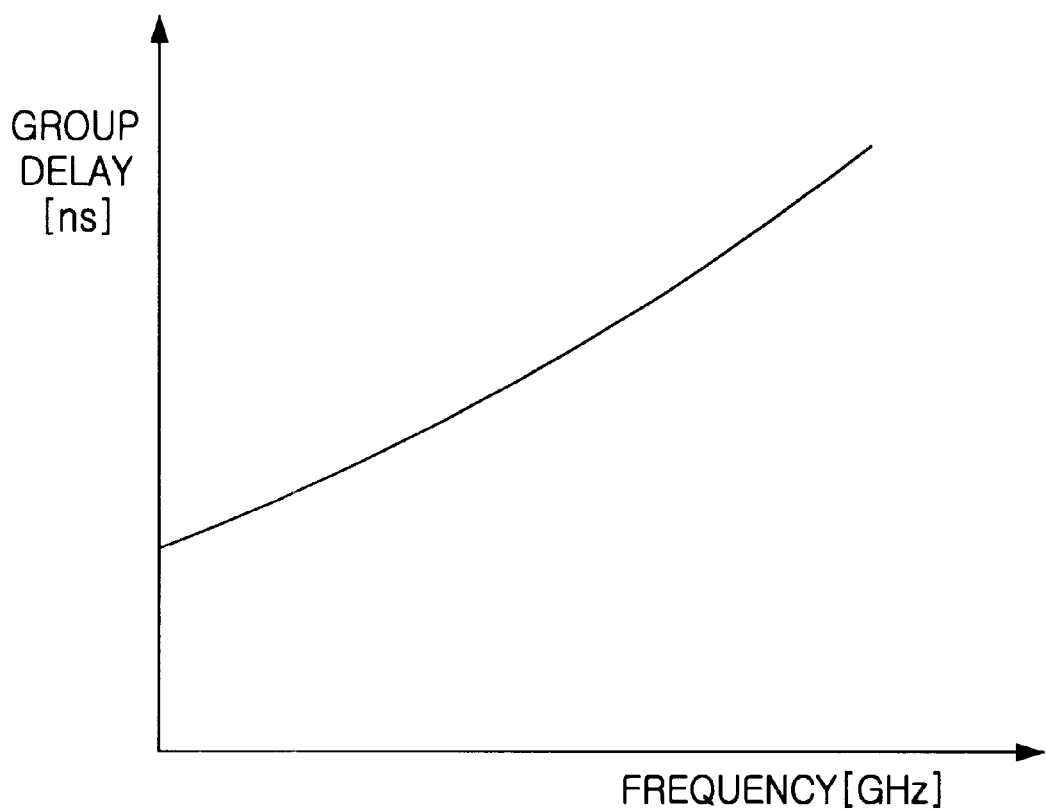
FIG. 35 illustrates a group delay of the magnetostatic wave device in accordance with the present invention.

FIG. 30 illustrates a ground plane layer. The distance between the multi-layer ferromagnetic substance structure 22 and grounded plane 32a and 33b is periodically adjusted to change the generation and transmission characteristic of the magnetostatic wave, thereby obtaining a linear group delay during transmission of the magnetostatic wave as shown in FIG. 35, and providing phase stability of the magnetostatic wave to minimize phase error.

According to the present invention described above, by providing a metal pattern around the line of the input and output electrodes, line width and energy emission on non-magnetization are reduced, thereby blocking energy transmission outside the pass band of the devices. When the energy transmission pass band of the devices is produced in the magnetically inactive substrate by placing the multi-layer structure having the metal pattern inserted at the input and output electrodes, pass band of the devices is increased.

Further a ground shield layer, which only a multiple ferromagnetic thin film can pass through, is inserted between the input and output electrodes to increase the distance between the input and output electrodes.

While the present invention has been described with respect to certain preferred embodiments only, other modifications and variations may be made without departing from the spirit and scope of the present invention as set forth in the following claims.

What is claimed is:

1. Magnetostatic devices, comprising:
   input and output electrodes for including energy conversion pattern provided on a dielectric substrate;
   a multi-layer magnetic substance structure placed at an upper portion of said dielectric substrate, wherein magnetically active thin film is placed at both sides of a magnetically inactive substrate;
   an upper shield, composed of grounded conductor, for preventing said input and output electrodes from electromagnetic coupling;
   a lower shield provided at said dielectric substrate, wherein said substrate contains a hole with the same length as the upper shield, and walls of said hole are provided with a conductor;
   a magnetostatic wave terminator, inserted onto said dielectric substrate to be placed at both end planes of said multi-layer magnetic structure, for absorbing said magnetostatic wave not to reflect therefrom; and
   a magnetostatic wave reflector, provided on said dielectric substrate as a line with a variable width, for reflecting and selecting a desired pass frequency band before it reaches to said mangnetostatic wave terminator.

2. The magnetostatic wave device as recited in claim 1, wherein said energy conversion pattern includes a single line whose width varies along a direction of length, and multiple lines in which a distance between neighboring lines varies along the direction of length.

3. The magnetostatic wave device as recited in claim 1, wherein said energy conversion pattern of said input and output electrodes includes an input and output portions comprising a certain pattern connected to a grounded plane or a separated open pattern.

4. The magnetostatic wave device as recited in claim 1, wherein said multi-layer magnetic substance structure includes a multi-layer structure where a magnetically active ferromagnetic substance working as magnetostatic energy transmission medium of said input and output electrodes is placed at both upper and lower sides of the magnetically inactive substrate.

5. The magnetostatic wave device as recited in claim 1, wherein said multi-layer magnetic substance structure includes multi-layer structure, in which a structure for said magnetostatic energy transmission medium of said input and output electrodes contains magnetically active ferromagnetic substance and a conductor having a certain pattern between said ferromagnetic substances.

6. The magnetostatic wave device as recited in claim 1, wherein said multi-layer magnetic substance structure includes the multi-layer structure, in which the two magnetically active ferromagnetic substances contains a structure whose center is separated in direction of said energy conversion pattern.

7. The magnetostatic wave device as recited in claim 1, wherein said multi-layer magnetic substance structure includes the multi-layer structure, in which the magnetically active ferromagnetic substance further contains a ferromagnetic substance layer on the two ferromagnetic substances which are separated in direction of said energy conversion pattern.

8. The magnetostatic wave device as recited in claim 1, wherein said lower shield includes a shield of conductive duct shape, in which a rectangular hole smaller than the length of the dielectric substrate is provided in the dielectric substrate and a conductive layer is provided to connect the rectangular wall of said rectangular hole to the grounded plane.

9. The magnetostatic wave device as recited in claim 1, wherein said dielectric substrate includes a shield which is composed of conductive structure equal to or smaller than the length of said substrate and is placed between cross sections of said substrate.

10. The magnetostatic wave device as recited in claim 1, wherein said upper shield includes a shield composed of a grounded upper plane.

11. The magnetostatic wave device as recited in claim 1, wherein said lower shield includes a shield, in which a rectangular hole smaller than the length of said dielectric substrate is provided in said dielectric substrate, and a conductive layer is provided to connect the rectangular wall of said rectangular hole to the grounded plane or grounded conductive structure.

12. The magnetostatic wave device as recited in claim 1, wherein said magnetostatic wave terminator is located on the dielectric substrate near both ends of said multi-layer magnetic substance structure.

13. The magnetostatic wave device as recited in claim 1, wherein said magnetostatic wave reflector includes a reflector composed of multiple number of lines, said lines are placed at both ends of said multi-layer magnetic thin film in the proceeding direction of said magnetostatic wave and the width of a pattern varies perpendicular to the proceeding direction of said magnetostatic wave.

14. The magnetostatic wave device as recited in claim 1, wherein said dielectric substrate includes a grounded lower plane containing a projected portion of each height perpendicular to transmission direction of said magnetostatic wave.

* * * * *